(12) United States Patent
Jiang et al.

(10) Patent No.: US 9,945,031 B2
(45) Date of Patent: Apr. 17, 2018

(54) GAS SHOWER DEVICE, CHEMICAL VAPOR DEPOSITION DEVICE AND METHOD

(71) Applicant: ADVANCED MICRO-FABRICATION EQUIPMENT INC, CHINA, Shanghai (CN)

(72) Inventors: Yong Jiang, Shanghai (CN); Zhiyou Du, Shanghai (CN)

(73) Assignee: ADVANCED MICRO-FABRICATION EQUIPMENT INC, CHINA, Shanghai (CN)

( * ) Notice: Subject to any disclaimer, the term of this patent is extended or adjusted under 35 U.S.C. 154(b) by 0 days.

(21) Appl. No.: 14/742,408

(22) Filed: Jun. 17, 2015

(65) Prior Publication Data

US 2015/0368799 A1 Dec. 24, 2015

(30) Foreign Application Priority Data

Jun. 18, 2014 (CN) .......................... 2014 1 0273262

(51) Int. Cl.
*C23C 16/44* (2006.01)
*C23C 16/455* (2006.01)

(52) U.S. Cl.
CPC .. *C23C 16/45565* (2013.01); *C23C 16/45574* (2013.01)

(58) Field of Classification Search
None
See application file for complete search history.

(56) References Cited

U.S. PATENT DOCUMENTS

| 2002/0073924 | A1* | 6/2002 | Chiang | C23C 16/0227 118/723 R |
| 2009/0308538 | A1* | 12/2009 | Yonekura | C23C 16/4581 156/345.51 |
| 2011/0011338 | A1* | 1/2011 | Chuc | C23C 16/452 118/715 |

* cited by examiner

*Primary Examiner* — Joseph A Miller, Jr.
(74) *Attorney, Agent, or Firm* — Womble Bond Dickinson (US) LLP; Joseph Bach, Esq.

(57) ABSTRACT

A gas shower device, a device and a method for chemical vapor deposition. A gas shower device has a showerhead. The showerhead includes a center region and a periphery region surrounding the center region; the center region and periphery region of the showerhead have a plurality of second gas-outlets which are arranged in parallel; the second gas-outlets are used to output the second gas; a first gas-outlet arranged between two adjacent second gas-outlets, includes the first sub-gas-outlet located in the center region and the second sub-gas-outlet located in the periphery region; the first sub-gas-outlet and the second sub-gas-outlet are mutually isolated, the first sub-gas-outlet is used to output the first gas and the second sub-gas-outlet is used to output the second gas; a first gas channel is connected to the first sub-gas-outlet; a second gas channel is connected to the second gas-outlet and the second sub-gas-outlet. The film formation quality is improved by using the chemical vapor deposition device with the gas shower device.

20 Claims, 6 Drawing Sheets

GAS SHOWER DEVICE, CHEMICAL VAPOR DEPOSITION DEVICE AND METHOD

CROSS-REFERENCE TO RELATED APPLICATIONS

The present application claims benefit of Chinese Application No. 201410273262.5, filed Jun. 18, 2014, the contents of which are incorporated herein by reference.

TECHNICAL FIELD

The present invention relates to semiconductor manufacturing technical field, especially to a gas shower device, a device and a method for chemical vapor deposition.

BACKGROUND TECHNOLOGY

Chemical vapor deposition (referred to as CVD) is the process technology that the reaction substances react under the gaseous condition to generate solid substance deposited on the surface of the heated solid substrate, thereby to obtain solid material, which is achieved by using chemical vapor deposition device. In particular, CVD device introduces the reaction gases into the reaction chamber by using the inlet device, controls the pressure, temperature and other reaction conditions in the reaction chamber so that the reaction gases will react, to complete the deposition process procedures.

Metal Organic Chemical Vapor Deposition (MOCVD) device is mainly used for the fabrication of thin monocrystalline function structural materials of III-V groups of compound, II-VI groups of compound or alloy, such as gallium nitride, gallium arsenide, indium phosphide, zinc oxide etc. With the continuous expanding of application scope of mentioned functional structural materials, MOVDC device has become an important chemical vapor deposition device. Metal organic chemical vapor deposition generally adopts II group or III group metal organic source, VI group or V group hydride source as the reaction gas, hydrogen or nitrogen as the carrier gas, conducting vapor phase epitaxy on the substrate by thermal decomposition to grow various II-VI groups of compound semiconductors, III-V groups of compound semiconductors, as well as their thin monocrystalline materials of multielement solid solution.

However, the quality of the thin film formed by current metal organic chemical vapor deposition device is poor. Therefore, it is necessary to improve the metal organic chemical vapor deposition device to improve the film formation quality of the device.

SUMMARY OF THE INVENTION

The present invention is to provide a gas shower device, a device and a method for chemical vapor deposition and the film formation quality is improved by using the chemical vapor deposition device with the gas shower device.

To solve above problem, the present invention provides a gas shower device, which includes:

A showerhead, the gas injection region at the bottom of the showerhead includes a center region and a periphery region surrounding the center region; the center region and periphery region of the showerhead have a plurality of second gas-outlets arranged in parallel; the second gas-outlets are used to output the second gas; a first gas-outlet is arranged between two adjacent second gas-outlets, the first gas-outlet and the second gas-outlet are mutually and alternatively distributed, the first gas-outlet comprises a first sub-gas-outlet located in the center region and a second sub-gas-outlet located in the periphery region; the first sub-gas-outlet and the second sub-gas-outlet are mutually isolated, the first sub-gas-outlet is used to output the first gas, and the second sub-gas-outlet is used to output the second gas, the first gas and the second gas could have film formation reaction;

A first gas channel is connected to the first sub-gas-outlet, the first gas passes through the first gas channel and outputs from the first sub-gas-outlet;

A second gas channel is connected to the second gas-outlet and the second sub-gas-outlet, the second gas channel and the first gas channel are mutually isolated, the second gas passes through the second gas channel and outputs from the second gas-outlet and the second sub-gas-outlet. Optionally, the size of the second gas-outlet is larger than the size of the first gas-outlet.

Optionally, the first gas-outlet and the second gas-outlet are strip-shaped gas channel.

Optionally, the strip width of the first gas-outlet is smaller than the strip width of the second gas-outlet; the strip width of the first sub-gas-outlet is identical with the strip width of the second sub-gas-outlet.

Optionally, the first gas-outlet is composed of a plurality of first gas holes arranged in straight line and the second gas-outlet is composed of a plurality of second gas holes arranged in straight line.

Optionally, the diameter of the first gas hole is smaller than the diameter of the second gas hole; the diameter of the first gas hole composing the first sub-gas-outlet is identical with the diameter of the first gas hole composing the second sub-gas-outlet. Optionally, the distance between the first sub-gas-outlet and the second sub-gas-outlet is 1 mm-3 mm.

Optionally, the radius of the center region is 5 mm-30 mm smaller than the radius of the periphery region.

Optionally, the distance between the center axis of the first gas-outlet and the center axis of the second gas-outlet is 10 mm-15 mm. Correspondingly, the present invention also provides a chemical vapor deposition device, including:

Reaction chamber;

The carrier located at the bottom of the reaction chamber, wherein, the carrier could rotate along the axis and the carrier has wafer mounting region, of which the surface is used to place the wafer;

The exhaust channel located at the bottom of the reaction chamber;

The gas shower device of any of the above items, wherein, the gas shower device is located on the top of the reaction chamber, wherein:

The first gas-outlet and the second gas-outlet face to the carrier, which are used to deliver the first gas and the second gas to the space between the gas shower device and the carrier;

The first gas channel is connected to the external of the reaction chamber and the first gas is input to the first gas channel from the external of the reaction chamber;

The second gas channel is connected to the external of the reaction chamber and the second gas is input to the second gas channel from the external of the reaction chamber.

Optionally, the first gas includes the metalorganic gas or group V hydrides gas, and the second gas is one or more of nitrogen-containing gas, hydrogen-containing gas and oxygen-containing gas.

Optionally, the second gas is single gas which could be nitrogen, hydrogen, oxygen or ammonia gas.

Optionally, the second gas is the gas mixed by multiple gases, which contains the mixed gas of nitrogen and hydrogen, or mixed gas of nitrogen, hydrogen and ammonia gas.

Optionally, the second gas also includes inert gas.

Optionally, when the first gas contains metalorganic gas, it does not contain group V hydrides gas; when the first gas contains group V hydrides gas, it does not contain metalorganic gas; the metalorganic gas and group V hydrides gas will be output from the first sub-gas-outlet alternatively.

Optionally, the wafer mounting region edge of the carrier is larger than center region edge and smaller than periphery region edge.

Optionally, it further includes: a gas flow confinement ring located surrounding the gas shower device and the carrier, which surrounds the space between the gas shower device and the carrier; the heater located at the bottom of carrier is used to heat the carrier. Correspondingly, the present invention also provides a chemical vapor deposition method by using the chemical vapor deposition device of any of the above items, including:

Placing the wafer on the surface of the wafer mounting region of the carrier;

Outputting the first gas from the first sub-gas-outlet to the direction of the carrier surface, when the first gas is input to the first gas channel from the external of the reaction chamber;

Outputting the second gas from the second gas-outlet and the second sub-gas-outlet to the direction of the carrier surface, when the second gas is input to the second gas channel from the external of the reaction chamber, wherein:

The second gas output from the second gas-outlet of the showerhead center region is mixed with the first gas output from the first sub-gas-outlet in the space between the gas shower device and the carrier, which reacts to form film at the wafer surface;

The second gas output from the second gas-outlet of the showerhead periphery region and the second sub-gas-outlet is generated gas curtain, which surrounds the space between showerhead center region and the carrier surface. Optionally, the flow rate of the second gas output from the second sub-gas-outlet is 85%-115% of the flow rate of the first gas output from the first sub-gas-outlet.

Optionally, the flow rate of the second gas output from the second gas-outlet is higher than the flow rate of the first gas output from the first sub-gas-outlet.

Correspondingly, the present invention also provides a gas shower device, including:

A showerhead, wherein, the gas injection region at the bottom of the showerhead includes a center region and a periphery region surrounding the center region; the gas injection region at the bottom of the showerhead also includes the first gas inlet region connected to the first gas source and the second gas inlet region connected to the second gas source;

The first gas inlet region includes multiple first gas inlets, and the first gas inlet region includes the first gas inlet strip in parallel located in center region at the bottom of the showerhead.

The second gas inlet region includes multiple second gas inlets, and the second gas inlet region includes the annular gas inlet strip which is located in periphery region at the bottom of the showerhead and surrounds the center region, as well as multiple second gas inlet strips in parallel in center region at the bottom of the showerhead, wherein, the second gas inlet strip and the first gas inlet strip are alternatively arranged. Correspondingly, the present invention also provides a chemical vapor deposition device, including:

Reaction chamber;

Carrier located at the bottom of the reaction chamber, wherein, the carrier could rotate along the axis and the carrier has wafer mounting region, of which the surface is used to place the wafer;

Exhaust channel located at the bottom of the reaction chamber;

Showerhead;

The gas injection region at bottom of the showerhead includes center region and periphery region surrounding center region, wherein, the periphery region includes multiple second gas inlets, the center region includes multiple first gas inlets and second gas inlets;

The showerhead further includes the first gas channel and the second gas channel, wherein, the first gas channel is connected to the first gas source and the second gas channel is connected to the second gas source;

The bottom of the first gas channel is connected to multiple first gas inlets in the center region;

The bottom of the second gas channel is connected to multiple second gas inlets in the center region and the second gas inlets in the periphery region. Optionally, in the center region of the showerhead, the first gas inlet and the second gas inlet are alternatively distributed in grid pattern; or, in the center region of the showerhead, the first gas inlet and the second gas inlet are multiple coaxial inlet pipes with different diameters, the first gas and the second gas are introduced into the reaction chamber through the coaxial inlet pipes with different diameters.

Optionally, the first gas source provides the gas containing metalorganic gas or group V hydrides gas and the second gas source provides one or more of nitrogen-containing gas, hydrogen-containing gas and oxygen-containing gas. In comparison with existing technologies, the technical solution in the present invention has the following advantages:

In the gas shower device of the present invention, the showerhead comprises a center region and a periphery region surrounding the center region, wherein, the center region and periphery region have several second gas-outlets arranged in parallel; the first gas-outlet arranged between two adjacent second gas-outlets comprises a first sub-gas-outlet located in the center region and a second sub-gas-outlet located in the periphery region.

The first sub-gas-outlet is used to output the first gas and the second sub-gas-outlet is used to output the second gas. Therefore, the periphery region of the showerhead can only output the second gas. The second gas output from the periphery region could generate gas curtain surrounding the first gas and the second gas output from the showerhead center region; the gas curtain closes the first gas and the second gas for reaction output from center region, thus the first gas and the second gas output from center region are mutually isolated from the external, ensuring the pureness of the first gas and the second gas in the reaction; in addition, it keeps stable gas flow of the first gas and the second gas stable.

Furthermore, the second gas is single gas, which could be nitrogen, hydrogen, oxygen or ammonia gas; the single gas has stable chemical properties and will not have decomposition reaction under the high temperature condition. Therefore, when periphery region of the showerhead outputs the single gas, the generated gas curtain has stable properties, providing stronger protection for the first gas and the second gas output from the center region.

Furthermore, the second gas is the mixed gas of several gases, which could be the mixed gas of nitrogen and hydrogen, or the mixed gas of nitrogen, hydrogen and ammonia gas; the mixed gas has stable chemical properties and will not have decomposition reaction under high temperature condition. Therefore, when periphery region of the showerhead outputs the multiple mixed gases, the generated gas curtain has stable properties, providing stronger protection for the first gas and the second gas output from the center region.

In the chemical vapor deposition device in the present invention, the gas shower device is located on top of reaction chamber; the first gas-outlet and the second gas-outlet face towards the carrier, which are used to deliver the first gas and the second gas to the space between the gas spray device and the carrier. The periphery region of showerhead can only outputs the second gas; in addition, the second gas output from the periphery region could generate gas curtain surrounding the first gas and the second gas output from the showerhead center region. Therefore, the gas curtain could mutually isolate the first gas and the second gas for reaction output from the center region from the internal wall of reaction chamber, thus avoiding that the first gas and the second gas have incomplete reaction on internal wall surface of the reaction chamber, forming the ash by-product with loosening texture attached on internal wall surface of the reaction chamber. Therefore, the impurity content in the thin film which is formed by the chemical vapor deposition device is reduced. In addition, the extra consumption of the first gas and the second gas which generates extra by-product is avoided, so that the utilization ratio of the first gas is increased, and the operation cost of chemical vapor deposition device is reduced. Due to avoidance of by-product formed on internal wall surface of the reaction chamber, the blackness and heat absorption capacity of the reaction chamber are reduced, so that the gas flow near reaction chamber internal wall is stable. Thus, the quality of the film formed by chemical vapor deposition device is improved.

Furthermore, the wafer mounting region edge of the carrier is larger than center region edge and smaller than periphery region edge. The first gas and the second gas output from the showerhead center region could be totally delivered to the wafer surface on wafer mounting region, be heated and react to form film. In addition, the periphery region of the showerhead outputs the second gas which could react with the first gas output from the center region; therefore, the wafer surface which is located in wafer mounting region and edge region corresponding to showerhead periphery region could form thin film with high quality, thus the integral film formed on wafer surface in the wafer mounting region has uniform thickness and high quality.

In the chemical vapor deposition method in the present invention, the wafer is placed on surface of wafer mounting region at the carrier; the second gas-outlet in showerhead center region outputs the second gas, the first sub-gas-outlet outputs the first gas, wherein, the first gas and the second gas are mixed in the space between the spray device and the carrier, and react on the wafer surface to form thin film. The second gas-outlet and the second sub-gas-outlet in showerhead periphery region output the second gas, the second gas output from the periphery region could generate gas curtain; the gas curtain could close the space between the showerhead center region and the carrier surface. The gas curtain could isolate the internal wall of reaction chamber from the first gas and the second gas output from the center region, thus avoiding that the first gas and the second gas generate by-product on internal wall surface of the reaction chamber. Therefore, the quality of thin film formed on wafer surface is improved, and the thickness is uniform.

Furthermore, the flow rate of the second gas output from the second sub-gas-outlet is 85%-115% of the flow rate of the first gas output from the first sub-gas-outlet. The flow rate of the gas output from the second sub-gas-outlet is close to the flow rate of the gas output form the first sub-gas-outlet, which could avoid thermal convection vortex caused by large difference between the flow rate of gas output from the second sub-gas-outlet and the flow rate of gas output from the first sub-gas-outlet, guaranteeing the stability of the gas flow in the reaction chamber.

DETAILED DESCRIPTION

As mentioned in the background technology, the quality of the thin film formed by current metal organic chemical vapor deposition device is poor.

Figure 1:
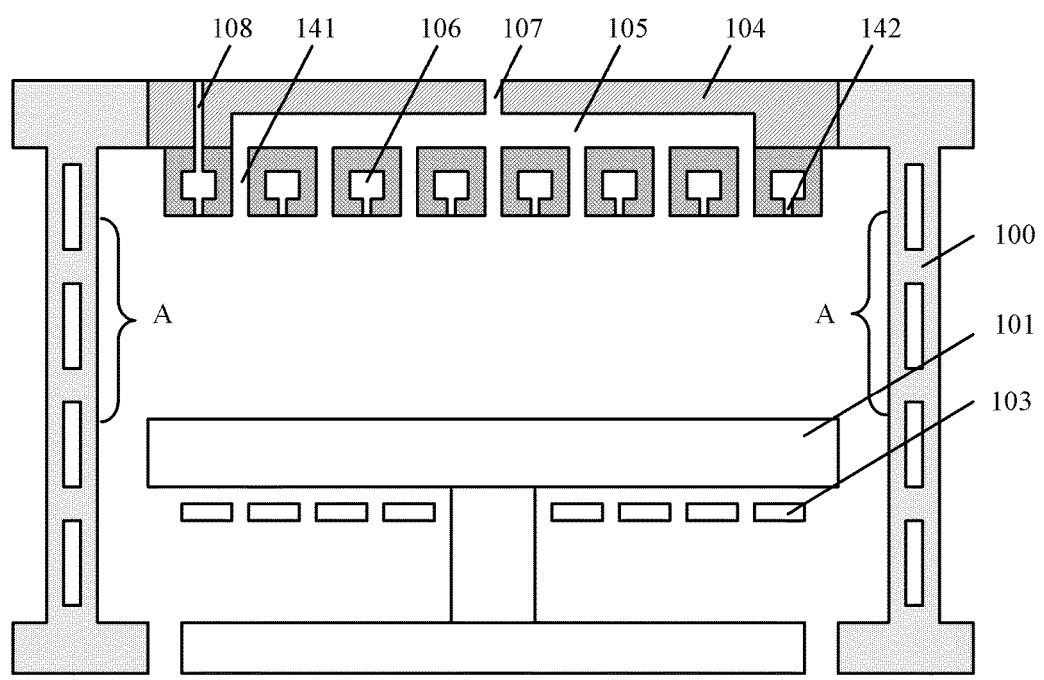
FIG. 1 is a cross-sectional structure view of a metal organic chemical vapor deposition device of the embodiments of the present invention.

According to the research findings, refer to FIG. 1, FIG. 1 is the cross-sectional structure view of a metal organic chemical vapor deposition device of the embodiments of the present invention, including:

Reaction chamber 100;

The carrier 101 located in the reaction chamber 100, wherein, the carrier 101 could rotate along the axis, the carrier 101 surface is used to place the wafer to be processed; the carrier 101 bottom has heating device 103 which is used to heat the wafer placed on the carrier 101;

The shower module 104 is located on top of the reaction chamber 100, and the shower module 104 is set oppositely to the carrier 101; the first gas chamber 105 and the second gas chamber 106 are mutually isolated in the shower module 104; the shower module 104 surface facing towards the carrier 101 has the first gas-outlet 141 and the second gas-outlet 142; the first gas-outlet 141 and the second gas-outlet 142 are arranged in parallel and mutually isolated; the first gas-outlet 141 is connected to the first gas chamber 105; the second gas-outlet 142 is connected to the second gas chamber 106; the first gas chamber 105 has the first gas transportation channel 107 connected to the external, and the second gas chamber 106 has the second gas transportation channel 108 connected to the external.

Further, in other embodiments, to confine the gas flow output from the first gas-outlet 141 and the second gas-outlet 142, the gas flow confinement ring is set around the carrier 101 and the shower module 104; the gas flow confinement ring surrounds the carrier 101, the shower module 104, as well the space between the carrier 101 and the shower module 104.

The metal organic chemical vapor deposition process adopts III group metal organic source gases and V group hydride source gases as the reaction gas to form the film on the wafer surface, or adopts II group metal organic source gases and VI group hydride source gases as the reaction gas to form the film on the wafer surface. Therefore, the first gas-outlet 141 and the second gas-outlet 142 are used to output III group metal organic source gases and V group hydride source gases, or II group metal organic source gases and VI group hydride source gases.

However, before the gases output from the first gas-outlet 141 and the second gas-outlet 142 reach the wafer surface, the gases easily contact the internal wall of the reaction chamber 100, react and generate by-product at the region A surface of the internal wall of the reaction chamber 100. In addition, the temperature of the internal wall surface of the reaction chamber 100 is lower than that of the wafer surface placed on the carrier 101, so that the gases output from the first gas-outlet 141 and the second gas-outlet 142 could not react completely, and the by-product attached on the region A surface of the internal wall of the reaction chamber 100 is loosening ash substance.

Due to loosening texture of the ash substance, it will be fell off by the impact of gas flow output from the first gas-outlet 141 and the second gas-outlet 142, and be taken into the inside of the reaction chamber 100, falling on the wafer surface and go against the quality of the film formation on the wafer surface.

Secondly, the ash substance is attached on the internal wall surface of the reaction chamber 100, so that the blackness of the internal wall surface of the reaction chamber 100 is enhanced; making the side wall of the reaction chamber 100 absorb the heat easily, and the temperature of the side wall of the reaction chamber 100 is increased, which destroys the optimized gas flow distribution near the side wall of the reaction chamber 100, and is easily to generate the thermal convection vortex in the region near the side wall of the reaction chamber 100, and to make the gas flow back to the carrier 101 easily, leading to decrease the film formation uniformity of the wafer surface.

Again, the gases output from the first gas-outlet 141 and the second gas-outlet 142 generate by-product on the region A surface of the internal wall of the reaction chamber 100, so the gases output from the first gas-outlet 141 and the second gas-outlet 142 are consumed. Thus, the utilization ratio of the gases for film formation reaction output from the first gas-outlet 141 and the second gas-outlet 142 is decreased, and the cost of metal organic chemical vapor deposition process is increased.

To solve the above problems, the prior art proposes to add an annular independently controlled gas inlets at the periphery of the gas showerhead; the purge gas is input to the reaction chamber 100 (such as inert gas) through the gas inlets surrounding the showerhead periphery; the purge gas vertically flows downwards at high flow rate to prevent the particles generated during the reaction from accumulating the side wall of reaction chamber 100 and forming ash substance, and to prohibit the vortex generated at the carrier 101 edge region to some extent. However, the way of adding the gas inlet structure at the edges needs an extra set of gas inlet to adjust the flow independently which costs high. Meanwhile, the purge gas does not participate in the reaction, and the reaction gas concentration in edge region is diluted during the downwards diffusion process, thus affecting the uniformity of reaction speed.

The present invention proposes a gas shower device and chemical vapor deposition device, wherein, in the gas shower device, the showerhead includes the center region and the periphery region surrounding the center region; among the gas species for film formation reaction, a second gases is selected to input from the periphery region of the showerhead to the internal of the reaction chamber, wherein the first set of gas are the gases not easily to have self-decomposition reaction, or not easily to have chemical reaction; the gas curtain composed of the second gas is generated surrounding the first gas and the second gas for film formation reaction output from the showerhead center region, which could isolate the side wall of the reaction chamber from the first gas and second gas for reaction, thus avoiding generating ash by-product with loosening texture on the side wall surface of the reaction chamber.

To better understand the above purpose, characteristics and advantages of the present invention, the following will describe the detailed embodiments of the present invention in combination with the drawings.

Figure 2:
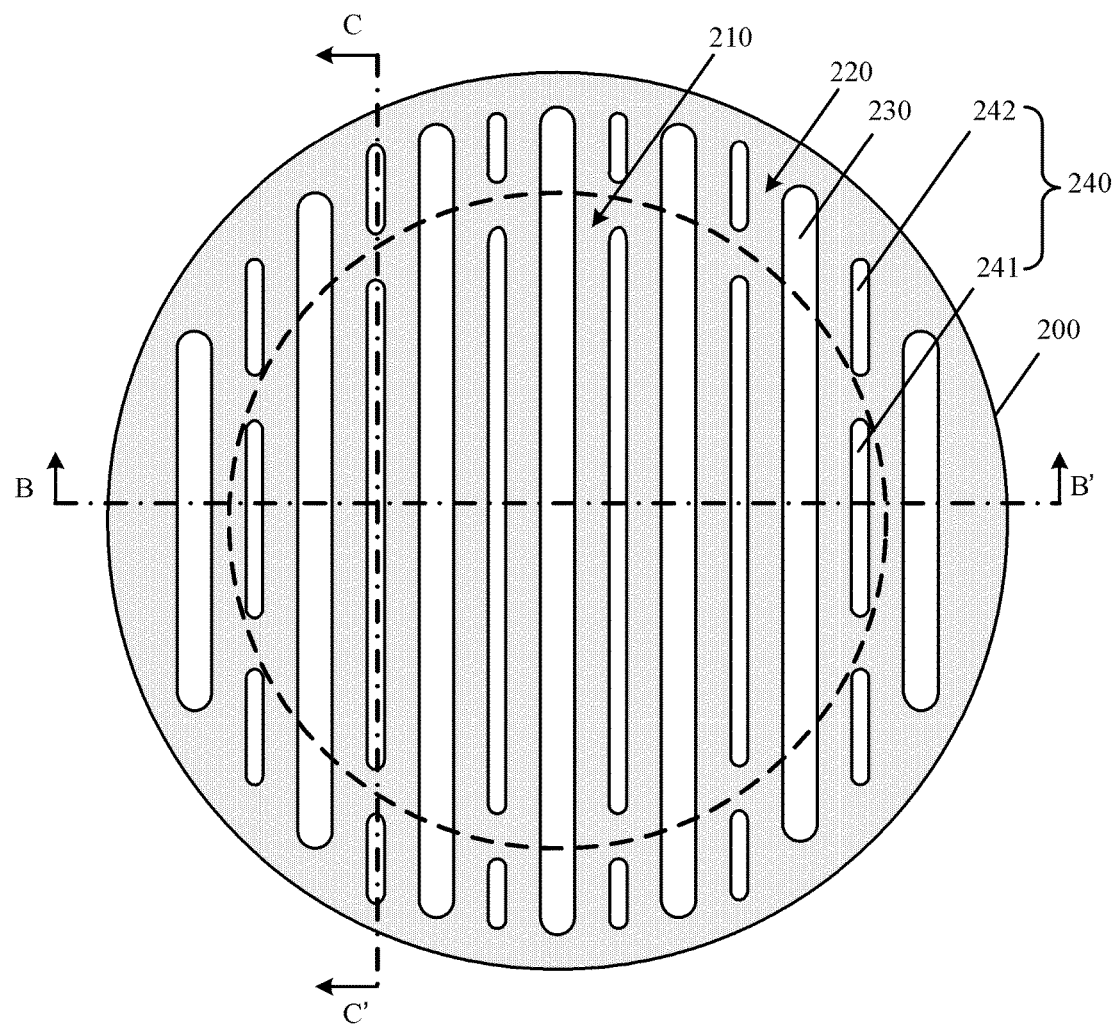
FIGS. 2-5 are the structure views of the gas shower device of the embodiments of the present invention.
Figure 3:
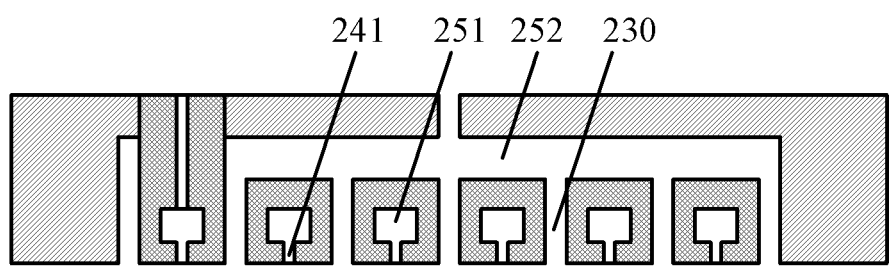
Figure 4:
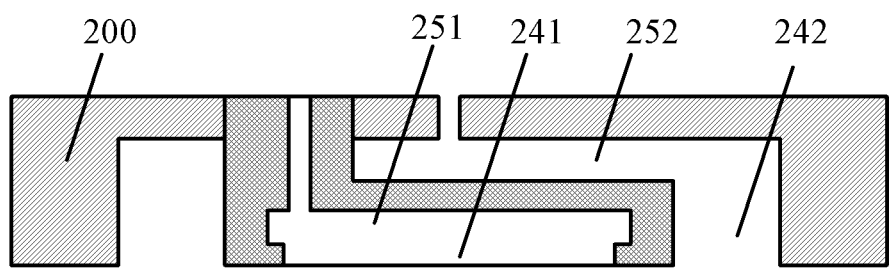

FIGS. 2-5 are the structure schematic drawings of the gas shower device of the embodiments of the present invention;

Please refer to FIGS. 2, 3 and 4; FIG. 3 is the cross-sectional structure view of FIG. 2 in BB' direction; FIG. 4 is the cross-sectional structure view of FIG. 2 in CC' direction; the gas shower device includes:

The showerhead 200, the gas injection region at the bottom of the showerhead 200 includes a center region 210 and a periphery region 220 surrounding the center region 210; the center region 210 and the periphery region 220 of the showerhead have a plurality of the second gas-outlets 230 arranged in parallel; the second gas-outlets 230 are used to output a second gas; a first gas-outlet 240 is arranged between two adjacent second gas-outlets 230, the first gas-outlet 240 and the second gas-outlet 230 are alternatively distributed, the first gas-outlet 240 comprises a first sub-gas-outlet 241 located in the center region 210 and a second sub-gas-outlet 242 located in the periphery region 220; the first sub-gas-outlet 241 and the second sub-gas-outlet 242 are mutually isolated, the first sub-gas-outlet 241 is used to output the first gas and the second sub-gas-outlet 242 is used to output the second gas, wherein, the first gas and the second gas could have film formation reaction;

The first gas channel 251 connected to the first sub-gas-outlet 241, the first gas passes through the first gas channel 251 and outputs from the first sub-gas-outlet 241;

The second gas channel 252 connected to the second gas-outlet 230 and the second sub-gas-outlet 242, wherein, the second gas channel 252 and the first gas channel 251 are mutually isolated, the second gas passes through the second gas channel 252 and outputs from the second gas-outlet 230 and the second sub-gas-outlet 242.

The following will describe the gas shower device in this embodiment in details.

The gas shower device is the shower device of the chemical vapor deposition device. In this embodiment, the gas shower device is used as the shower device of the metal organic chemical vapor deposition device. In other embodiments, the gas shower device can be used as the shower device of other chemical vapor deposition devices, such as low voltage chemical vapor deposition device, plasma enhanced chemical vapor deposition device, etc.

The showerhead 200 is used to output the first gas and the second gas; the showerhead 200 faces towards the carrier of chemical vapor deposition device, so that the first gas and the second gas are delivered to the surface of carrier, thus forming the thin film on the wafer surface placed on the carrier. In this embodiment, the showerhead 200 facing towards the carrier is the circular shape; in other embodiments, the showerhead facing towards the carrier could be square, polygon or other shapes cooperating with the chemical vapor deposition device.

The first gas and the second gas are used for film formation reaction, the first gas is output from the first sub-gas-outlet 241 located in the center region 210, and the second gas is output from the second gas-outlet 230 and the second sub-gas-outlet 242. The first gas-outlet 240 and the second gas-outlet 230 are arranged in parallel and distributed alternatively, i.e. the first sub-gas-outlet 241 and the second gas-outlet 230 are arranged in parallel and distributed alternatively; therefore, the first gas output from the first sub-gas-outlet 241 could be sufficiently mixed with the second gas output from the second gas-outlet 230, and sufficiently react on the wafer surface, thus forming the thin film with uniform density and thickness.

In this embodiment, the distance between the central axis of the first gas-outlet 240 and the central axis of the second gas-outlet 230 is 10 mm-15 mm. The distance between the central axis of the first gas-outlet 240 and the central axis of the adjacent second gas-outlet 230 is quite small, so that the first gas output from the first gas-outlet 240 could be sufficiently mixed with the second gas output from the second gas-outlet 230; therefore, the first gas and the second gas could react on the wafer surface sufficiently and form the uniform and compact thin film.

In this embodiment, the gas shower device is used as the shower device of the metal organic chemical vapor deposition device, therefore, the first gas includes the metalorganic gas or group V hydrides gas; the second gas is one or more species of gas selected form nitrogen-containing gas, hydrogen-containing gas and oxygen-containing gas; the gas containing the metalorganic gas and the gas containing the group V hydrides gas could react with the nitrogen-containing gas, hydrogen-containing gas and the oxygen-containing gas under high temperature conditions, to form the Group IIIA □ VIA compound material thin film.

During the chemical reaction process to generate object film, the demanded quantity of the second gas is higher than that of the first gas; therefore, the size of the second gas-outlet 230 is larger than that of the first gas-outlet 240.

In this embodiment, the first gas-outlet 240 and the second gas-outlet 230 are strip shaped gas channels. The strip width of the second gas-outlet 230 is larger than the strip width of the first gas-outlet 240, so that the output amount of the second gas is relatively larger; correspondingly, the output amount of the second gas from the second gas-outlet is relatively smaller, to avoid gas flow vortex due to the huge difference between the flux of the first gas and that of the second gas, and to avoid the poor uniformity of the formed thin film. Secondly, the strip width of the first sub-gas-outlet 241 is identical with the strip width of the second gas-outlet 242.

Figure 5:
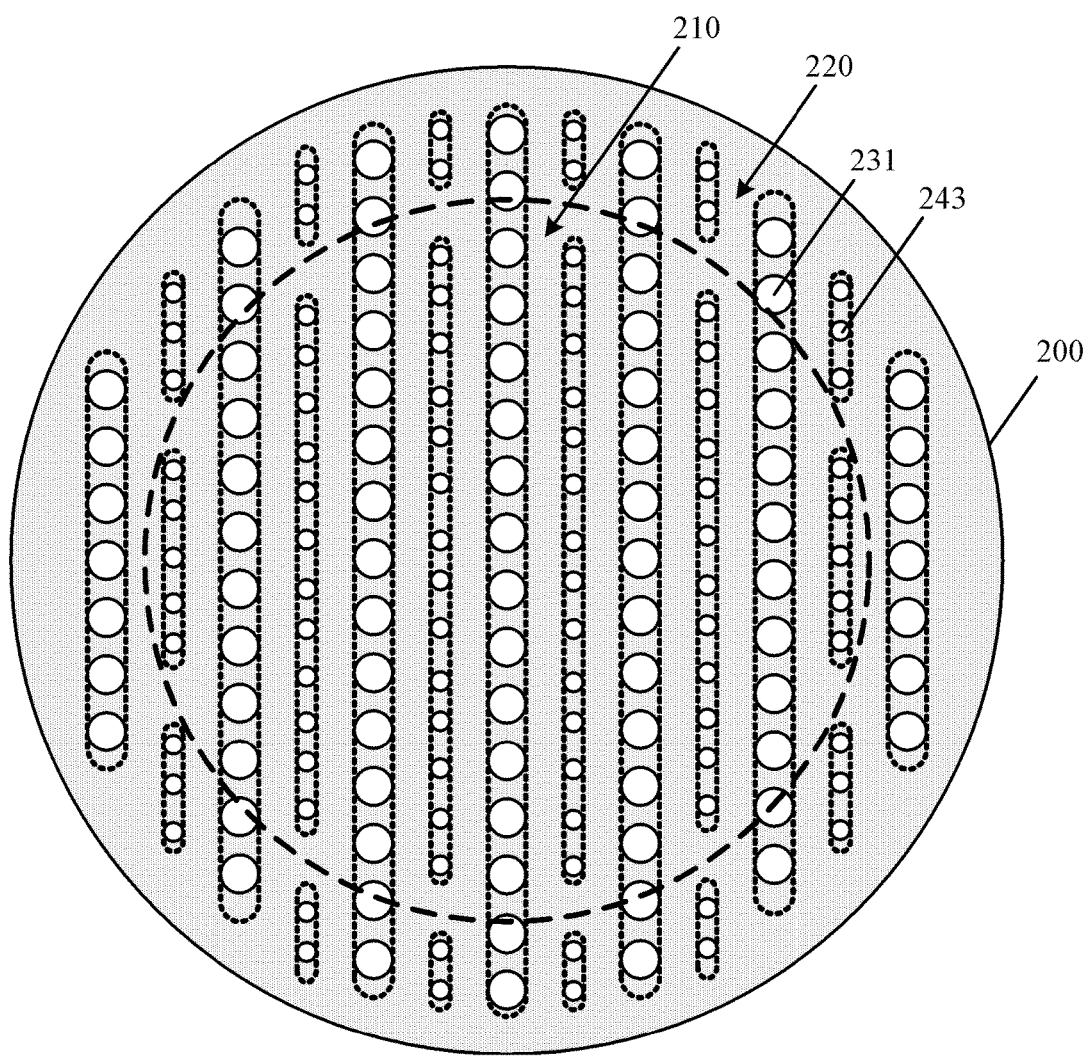

In another embodiment, as shown in FIG. 5, the first gas-outlet is composed of a plurality of the first gas holes 243 arranged in straight line and the second gas-outlet is composed of several second gas holes 231 arranged in straight line. Wherein, the diameter of the first gas hole 243 is smaller than the diameter of the second gas hole 231; the diameter of the first gas hole 243 located in the center region 210 is identical with the diameter of the first gas hole 243 located in the periphery region 220; the first gas hole located in the center region 210 is used to form the first sub-gas-outlet, and the first gas hole 243 located in the periphery region 220 is used to form the second sub-gas-outlet.

The showerhead 200 comprises a center region 210 and a periphery region 220 surrounding the center region 210; the periphery region 220 of the showerhead 200 can only output the second gas, the center region 210 of the showerhead 200 outputs the first gas and the second gas; therefore, the second gas output from the periphery region 220 could generate gas curtain surrounding the first gas and the second gas output from the center region 210; the mixed gas of the first gas and the second gas output from the center region 210 is used to react on the wafer surface at high temperature to form the thin film, while the gas curtain generated by the second gas output from the periphery region 220 could isolate the mixed gas output from the center region 210 from the external environment or the device surround reaction space, ensuring the cleanness of the first gas and the second gas output from the center region 210 and improving the quality of film formation.

Specifically, the showerhead 200 has a plurality of second gas-outlets 230 arranged in parallel; the first gas-outlet 240 is arranged between the second gas-outlets 230; the second gas-outlet 230 and the first gas-outlet 240 are distributed alternatively. Therefore, in a plurality of second gas-outlets 230 and a plurality of first gas-outlets 240, the second gas-outlets 230 are always arranged on the edge; also, the second gas-outlets 230 arranged on the edge are located in the periphery region 220, while other several second gas-outlets 230 run through the center region 210, with two ends located in the periphery region 220. Secondly, the first sub-gas-outlet 241 of the first gas-outlet 240 is located in the center region; the second sub-gas-outlet 242 is located in the periphery region 220. The second gas-outlet 230 and the second sub-gas-outlet 242 both output the second gas, so the gas output from the periphery region 220 is only the second gas which will generate the gas curtain.

In the first gas-outlet 240, the first sub-gas-outlet 241 and the second sub-gas-outlet 242 are mutually isolated, so that the second gas and the first gas output from the first gas-outlet 240 are mutually isolated. Further, the distance between the first gas-outlet 241 and the second sub-gas-outlet 242 is 1 mm-3 mm; due to the small distance between the adjacent first sub-gas-outlet 241 and the second sub-gas-outlet 242, it could avoid the gas flow turbulence due to large distance between the first gas and the second gas, thus preventing the occurrence of thermal convection vortex.

In this embodiment, the radius of the center region 210 is 5 mm-30 mm smaller than the radius of periphery region 220. The radius difference between the periphery region 220 and the center region 210 determines the thickness of the gas curtain generated by the second gas output from the periphery region 220, further determines the isolation capability of the second gas output from the periphery region 220 against the mixed gas output from the center region 210.

In one embodiment, the second gas is single gas, which could be nitrogen, hydrogen, oxygen or ammonia gas; the single gas has stable chemical properties and will not have self-decomposition reaction under high temperature condition. Therefore, when periphery region 220 of the showerhead 200 outputs the single gas, the generated gas curtain has stable properties, providing stronger protection and isolation for the first gas and the second gas output from the center region 210.

In another embodiment, the second gas is the mixed gas of several gases, which could be the mixed gas of nitrogen and hydrogen, or the mixed gas of nitrogen, hydrogen and ammonia gas; the mixed gas has stable chemical properties and will not have chemical reaction under high temperature condition. When the mixed gases output from the periphery region 220 of the showerhead 200, the generated gas curtain of the second gas has stable properties, providing stronger protection and isolation for the first gas and the second gas output from the center region 210.

In addition, the second gas could also include the inert gas, wherein, the inert gas is the carrier gas which can be used to uniformly disperse the single gas or multiple mixed gases, so that the flux of the second gas could meet the process requirements.

In this embodiment, the first sub-gas-outlet 241 is used to output the first gas, and the first gas includes the metalorganic gas or group V hydrides gas. The gas containing the metalorganic gas and the gas containing the group V hydrides gas are successively and alternatively output from the first sub-gas-outlet 241. When the first gas contains metalorganic gas, it does not contain group V hydrides gas, when the first gas contains group V hydrides gas, it does not contain metalorganic gas, so the gas containing the metalorganic gas and the gas containing the group V hydrides gas react with the second gas to form film. In addition, the first gas may contain carrier gas which may be inert gas or non-reaction gas.

Specifically, the first gas channel 251 connected to the first sub-gas-outlet 241 is connected to the metalorganic gas gas source and group V hydrides gas gas source, respectively; so that the metalorganic gas gas source and group V hydrides gas gas source could successively and alternatively deliver the gas containing metalorganic gas and gas containing group V hydrides gas by the regulation of control system, then the first sub-gas-outlet 241 successively and alternatively outputs the gas containing metalorganic gas and gas containing group V hydrides gas.

As shown in FIG. 3 and FIG. 4, the first sub-gas-outlet 241 is used to output the first gas, the first sub-gas-outlet 241 is connected to the first gas channel 251; the first gas channel 251 is used to input the first gas, so that the first gas could be output from the first sub-gas-outlet 241. The second gas-outlet 230 and the second sub-gas-outlet 242 are both used to output the second gas, so the second gas-outlet 230 and the second sub-gas-outlet 242 are connected to the second gas channel 252; the second gas channel 252 is used to input the second gas, so that the second gas could be output from the second gas-outlet 230 and the second sub-gas-outlet 242.

In the gas shower device of the present embodiment, the second gas channel 252 and the first gas channel 251 are mutually isolated. The showerhead only outputs the first gas and the second gas, so only the first gas channel 251 and the second gas channel 252 are set in the gas shower device, so that gas shower device has simple structure and compacts the structure size; in addition, the manufacturing cost of the gas shower device can be correspondingly reduced.

In this embodiment, the showerhead comprises a center region and a periphery region surrounding the center region, wherein, the center region and the periphery region have a plurality of the second gas-outlets arranged in parallel; the first gas-outlet arranged between two adjacent second gas-outlets comprises a first sub-gas-outlet located in the center region and a second sub-gas-outlet located in the periphery region. The first sub-gas-outlet is used to output the first gas and the second sub-gas-outlet is used to output the second gas. Therefore, the periphery region of the showerhead can only output the second gas. The second gas output from the periphery region could generate gas curtain surrounding the first gas and the second gas output from the showerhead center region; the gas curtain surrounds the first gas and the second gas for reaction output from center region, thus the first gas and the second gas output from center region are mutually isolated from the external, ensuring the pureness of the first gas and the second gas engaged in the reaction; in addition, it enables the gas flow of the first gas and the second gas stable.

The embodiments of the present invention also provide a structure of the gas shower device, including:

The showerhead, wherein, the gas injection region at the bottom of the showerhead includes a center region and a periphery region surrounding the center region; the gas injection region at the bottom of the showerhead also includes the first gas inlet region connected to the first gas source and the second gas inlet region connected to the second gas source;

The first gas inlet region includes multiple first gas inlets, and the first gas inlet region includes a plurality of the first gas inlet strips in parallel located in center region at the bottom of the showerhead.

The second gas inlet region includes multiple second gas inlets, and the second gas inlet region includes the annular gas inlet strip which is located in periphery region at the bottom of the showerhead and surrounds the center region, as well as multiple second gas inlet strips in parallel in center region at the bottom of the showerhead, the second gas inlet strips and the first gas inlet strips are alternatively arranged.

Figure 6:
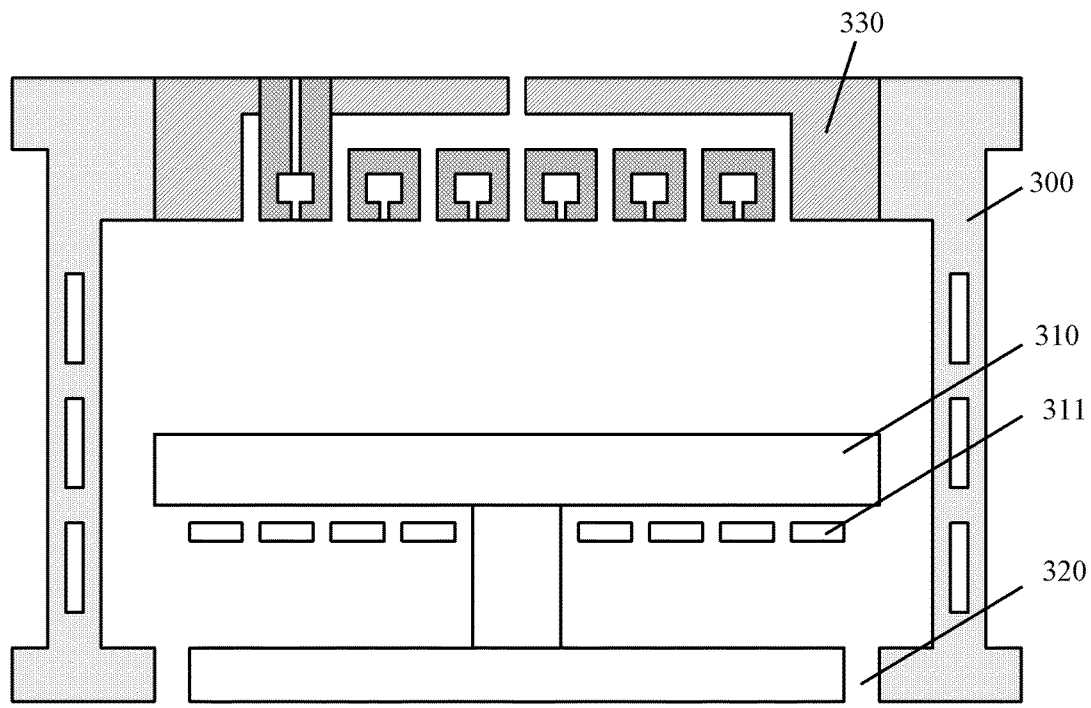
FIG. 6 is a structure view of the chemical vapor deposition device of the embodiments of the present invention.

Correspondingly, the embodiments of the present invention also provide a chemical vapor deposition device adopting the above gas shower device; FIG. 6 is a structure schematic view of the chemical vapor deposition device of the embodiments of the present invention;

As shown in FIG. 6, the chemical vapor deposition device includes:

Reaction chamber 300;

Carrier 310 located at the bottom of the reaction chamber 300, the carrier 310 could rotate along the axis and the carrier 310 has wafer mounting region, of which the surface is used to place the wafer;

Exhaust channel 320 located at the bottom of the reaction chamber 300;

Gas shower device 330, the gas shower device 330 is located on the top of the reaction chamber 300; the gas shower device 330 is shown in FIGS. 2-5, wherein:

The first gas-outlet 240 (as shown in FIG. 2) and the second gas-outlet 230 (as shown in FIG. 2) face towards the carrier 310, which are used to deliver the first gas and the second gas to the space between the gas shower device 330 and the carrier 310;

The first gas channel is connected to the external of the reaction chamber 300, and the first gas is input from the external of the reaction chamber to the first gas channel;

The second gas channel is connected to the external of the reaction chamber 300, and the second gas is input from the external of the reaction chamber to the second gas channel;

The following will describe the chemical vapor deposition device of this embodiment in details.

In this embodiment, the chemical vapor deposition device is the metal organic chemical vapor deposition device. In other embodiments, the chemical vapor deposition device can be other chemical vapor deposition device.

Based on FIG. 6, in combination with FIG. 2-5, in the gas shower device 300, the showerhead 200 facing to the carrier 310 has a center region 210 and a periphery region 220 surrounding the center region 210; wherein, the first sub-gas-outlet 241 located in the center region 210 is used to output the first gas and the second gas-outlet 230 located in the center region 210 is used to output the second gas; the first gas and the second gas output from the center region 210 are used to have chemical reaction on the wafer surface at high temperature and form the thin film. The second gas-outlet 230 and the second sub-gas-outlet 242 located in the periphery region are used to output the second gas; the second gas output from the periphery region 220 could generate gas curtain surrounding the space between the center region 210 of the showerhead 220 and the carrier 310. The gas curtain could mutually isolate the first gas and the second gas for reaction output from the center region 210 from the internal wall of the reaction chamber 300, to avoid that the first gas and the second gas output from the center region 210 react on the internal wall surface of the reaction chamber 300 and generate by-product before contacting the wafer surface. Therefore, the internal wall of the reaction chamber 300 could be kept clean to reduce the blackness and heat absorption capacity of the internal wall surface of the reaction chamber 300, depress the temperature difference between the side wall of reaction chamber 300 and the internal space of the reaction chamber 300, to ensure the stability of the gas flow distribution especially the gas flow near the internal wall of the reaction chamber 300 and to avoid gas thermal convection vortex.

Furthermore, the first gas and the second gas output from the center region will not generate by-product on the internal wall surface of the reaction chamber 300 before contacting the wafer surface, to reduce the extra consumption of the first gas and the second gas which are output from the center region 210, improving the utilization ratio of the first gas and the second gas. In this embodiment, the first gas includes the metalorganic gas or group V hydrides gas; due to the high cost of the first gas, the operation cost of the chemical vapor deposition device in the present embodiment is reduced when the consumption of the first gas is decreased.

In this embodiment, the carrier 310 rotates along the center axis, so that the gas output from the gas shower device 330 could be uniformly distributed on the wafer surface at the wafer mounting region 311 of the carrier 310. The center axis of the gas shower device 330 coincides with the center axis of the carrier 310, while the radius of wafer mounting region 311 of the carrier 310 is larger than the radius of the center region 210 of the showerhead 200 but smaller than the outer radius of the periphery region 220, so that the edge of the wafer mounting region 311 of the substrate 310 is in the corresponding region between the edge of center region 210 and the edge of periphery region 220. The first gas and the second gas output from the center region 210 of the showerhead can be totally delivered to the wafer surface of wafer mounting region 311, completely used for film formation. Meanwhile, the periphery region 220 outputs the second gas which could react with the first gas; therefore, the second gas could supplement the second gas output from the center region 210 except forming the gas curtain for isolation; the wafer surface at edge of wafer mounting region 311 reacts with the first gas and form the film, so that the wafer surface of the wafer mounting region 311 could form the thin film with high overall uniform thickness and high quality.

The distance from the gas shower device 330 to the surface of the substrate 310 is 50 mm-100 mm. The distance from the gas shower device 330 to the surface of the substrate 310 depends on the distance between the first gas-outlet 240 and the second gas-outlet 230; the smaller distance between the gas shower device 330 and the surface of the carrier 310, the smaller distance between the center axis of the first gas-outlet 240 and the center axis of the adjacent second gas-outlet 230, ensuring that the gas output from the first gas-outlet 240 and the gas output from the second gas-outlet 230 can be sufficiently mixed before contacting the wafer surface.

In this embodiment, the chemical vapor deposition device also includes: the heater 311 located under the carrier 310, which is used to heat the wafer on the surface of the carrier 310, so that the first gas and the second gas could be heated on the wafer surface and have chemical reaction to form the thin film.

In another embodiment, it also includes: gas flow confinement ring located surrounding the gas shower device 330 and carrier 310, which surrounds the space between the gas shower device 330 and the carrier 310; the gas flow confinement ring is used to control the gas flow in the space between the gas shower device 330 and the carrier 310, to avoid the thermal convection vortex in the reaction chamber 300.

In this embodiment, the gas shower device is located on the top of the reaction chamber; the first gas-outlet and the second gas-outlet face towards the carrier, which are used to deliver the first gas and the second gas to the space between the gas shower device and the carrier. The periphery region of showerhead can only outputs the second gas; in addition, the second gas output from the periphery region could generate gas curtain surrounding the first gas and the second gas output from the showerhead center region. Therefore, the gas curtain could mutually isolate the first gas and the second gas for reaction output from the center region from the internal wall of reaction chamber, thus avoiding that the first gas and the second gas have incomplete reaction on the internal wall surface of the reaction chamber, forming the ash by-product with loosening texture attached on the internal wall surface of the reaction chamber. Therefore, the impurity content in the thin film which is formed by the chemical vapor deposition device is reduced. In addition, the extra consumption of the first gas and the second gas which generates extra by-product is avoided, so that the utilization ratio of the first gas is increased, and the operation cost of chemical vapor deposition device is reduced. Due to the avoidance of by-product formed on the internal wall surface of the reaction chamber, the blackness and heat absorption capacity of the reaction chamber are reduced, so that the gas flow near the internal wall of the reaction chamber is stable. Thus, the quality of the film formed by chemical vapor deposition device is improved.

The embodiment of the present invention also provides a chemical vapor deposition device, including:

Reaction chamber;

Carrier located at the bottom of the reaction chamber, the carrier could rotate along the axis and the carrier has wafer mounting region, of which the surface is used to place the wafer;

Exhaust channel located at the bottom of the reaction chamber;

Showerhead;

The gas injection region at the bottom of the showerhead includes a center region and a periphery region surrounding the center region, wherein, the periphery region includes multiple second gas inlets, the center region includes multiple first gas inlets and second gas inlets;

The showerhead also includes the first gas channel and the second gas channel, the first gas channel is connected to the first gas source and the second gas channel is connected to the second gas source;

The bottom of the first gas channel is connected to multiple first gas inlets of the center region;

The bottom of the second gas channel is connected to multiple second gas inlets of the center region and the second gas inlets of the periphery region.

The first gas source provides the gas containing metalorganic gas or group V hydrides gas and the second gas source provides one or more species of nitrogen-containing gas, hydrogen-containing gas and oxygen-containing gas.

Figure 7:
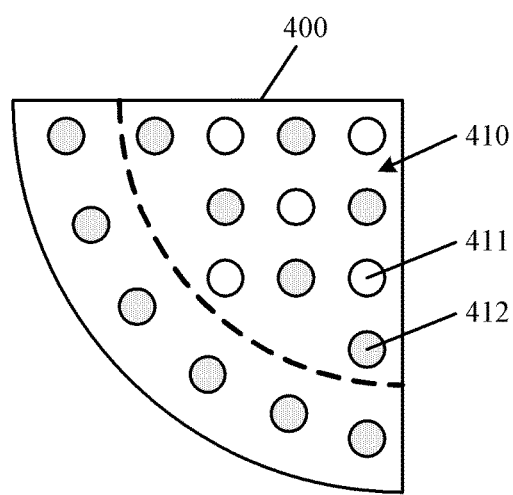
FIG. 7 is a view of local region of the center region at the bottom of the showerhead in the chemical vapor deposition device of another embodiment of the present invention.

In the embodiment, in the center region 410 of the showerhead 400, the first gas inlet 411 and the second gas inlet 412 are alternatively distributed in grid pattern, as shown in FIG. 7; FIG. 7 is the view of local region at the bottom of the showerhead.

Figure 8:
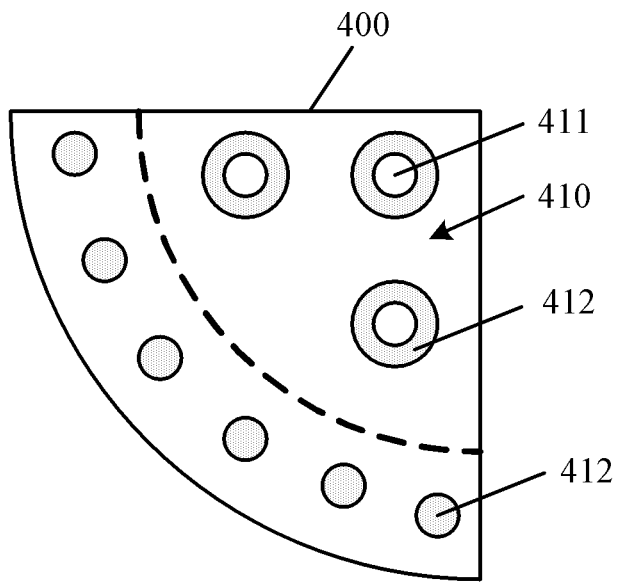
FIG. 8 is view of local region of the center region at bottom of the showerhead in the chemical vapor deposition device of another embodiment of the present invention.

In another embodiment, in the center region 410 of the showerhead 400, the first gas inlet 411 and the second gas inlet 412 are multiple coaxial inlet pipes with different diameters, the first gas and the second gas are introduced into the reaction chamber through the coaxial inlet pipes with different diameters, as shown in FIG. 8; FIG. 8 is the view of local region at the bottom of the showerhead.

In this embodiment, the second gas which is not easily to have thermal decomposition is input from the periphery at the bottom of the gas showerhead; the second gas output from the periphery region forms a gas curtain to prevent the product generated by the mixed first gas and the second gas in the gas curtain from being attached to the reaction chamber internal wall and forming contaminant. The center region of the gas showerhead is used to output the mixed gas of the first gas and the second gas; the first gas and the second gas are output from multiple first inlets and the second inlets which are alternatively and separately arranged, ensuring that the first gas and the second gas cannot have reaction until they flow downwards near the carrier.

In the embodiments of the present invention, besides the mixed gas output from the center region described in previous embodiments, which is that the first gas and the second gas are introduced into the reaction chamber by mutually isolated strip gas channel, it may be as described in the present embodiment, the first inlet and the second inlet are alternatively distributed in grid pattern. Or, the first gas and the second gas are introduced into the reaction chamber from multiple coaxial inlet pipes with different diameters. The above embodiments could achieve good mixing of two reaction gases in the center region.

The bottom of the gas showerhead proposed in this embodiment is located in the center region, which is used to achieve good mixing of two reaction gases; the periphery of the center region has the periphery region including the second gas inlet. In comparison with the prior technologies which require additional gas source and gas delivery channel, and the purge gas is introduced from the edge region of the gas showerhead, the present invention does not need the additional gas flow control system or the additional pipe connected to the purge gas source; the present invention just modifies the connections structure of the first gas chamber 105 (as shown in FIG. 1) and the second gas chamber 106 (as shown in FIG. 1) of the showerhead to prevent depositing the contaminant on the side wall of the reaction chamber in the present embodiment; meanwhile, it will not affect the distribution uniformity of reaction gas above the carrier.

Figure 9:
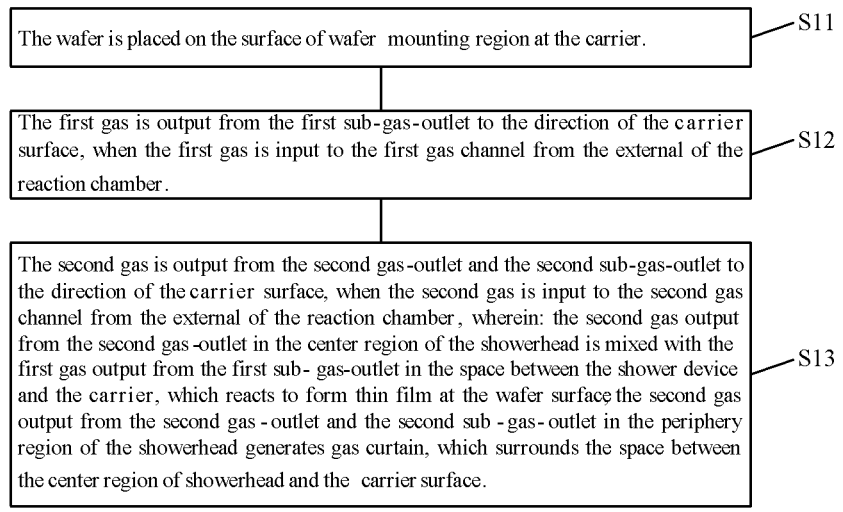
FIG. 9 is the flow chart of the chemical vapor deposition process of the embodiments of the present invention.

Correspondingly, the embodiment of the present invention also provides a chemical vapor deposition method for using the chemical vapor deposition device. FIG. 9 is the flow chart of the chemical vapor deposition process for the embodiments of the present invention, including:

Step S11, the wafer is placed on surface of wafer mounting region at the carrier;

Step S12, the first gas is output from the first sub-gas-outlet to the direction of the carrier surface, when the first gas is input to the first gas channel from the external of the reaction chamber;

Step S13, the second gas is output from the second gas-outlet and the second sub-gas-outlet to the direction of the carrier surface, when the second gas is input to the second gas channel from the external of the reaction chamber wherein: the second gas output from the second gas-outlet in the center region of the showerhead is mixed with the first gas output from the first sub-gas-outlet in the space between the shower device and the carrier, which reacts to form film at the wafer surface; the second gas output from the second gas-outlet and the second sub-gas-outlet located in the showerhead periphery region generates the gas curtain, which surrounds the space between the center region of the showerhead and the carrier surface. In this embodiment, steps 12 and 13 are implemented simultaneously, to output the first gas and the second gas to the reaction chamber 300 simultaneously.

Wherein, the flow rate of the second gas output from the second sub-gas-outlet 242 (as shown in FIG. 2) is 85%-115% of the flow rate of the first gas output from the first sub-gas-outlet 241 (as shown in FIG. 2). Due to the small distance between the adjacent first sub-gas-outlet 241 and the second sub-gas-outlet 242, when the flow rate of the second gas output from the second sub-gas-outlet 242 is close to the flow rate of the first gas output from the first sub-gas-outlet 241, it could prevent the occurrence of gas vortex due to the flow velocity difference between the first gas and the second gas, ensuring high quality of the film formation on the wafer surface.

In this embodiment, the chemical vapor deposition method is metal organic vapor deposition process, the second gas is one or more gas selected from nitrogen-containing gas, hydrogen-containing gas and oxygen-containing gas, the first gas contains metalorganic gas or group V hydrides gas; while the consumption of the second gas is larger than that of the first gas; therefore, the flow rate of the second gas output from the second gas-outlet 230 is faster than the flow rate of the first gas output from the first sub-gas-outlet 241, so that the content of the second gas in the reaction chamber 300 is larger than that of the first gas.

In this embodiment, the wafer is placed on the surface of the wafer mounting region of the carrier; the second gas-outlet in center region of the showerhead outputs the second gas, the first sub-gas-outlet outputs the first gas, wherein, the first gas and the second gas are mixed in the space between the shower device and the carrier, and react on the wafer surface to form thin film. The second gas-outlet and the second sub-gas-outlet in the periphery region of the showerhead output the second gas, the second gas output from the periphery region could generate gas curtain; the gas curtain could surround the space between the center region of the showerhead and the carrier surface. The gas curtain could isolate the internal wall of the reaction chamber from the first gas and the second gas output from the center region, to avoid that the first gas and the second gas generate by-product on the internal wall surface of the reaction chamber. Therefore, the quality of thin film formed on wafer surface is improved, and the thickness is uniform. It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of functional elements will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the relevant arts. It is intended that the specification and examples be considered as exemplary only, with a true scope and spirit of the invention being indicated by the following claims.

The invention claimed is:

1. A gas shower device, comprising:
a showerhead, a gas injection region at the bottom of the showerhead includes a center region and a periphery region surrounding the center region;
the center region and periphery region of the showerhead have a plurality of second gas-outlets which are strip shaped gas channels all of which having centerlines arranged in parallel relative to each other;
the second gas-outlets are used to output a second gas;
a first gas-outlet is arranged between two adjacent second gas-outlets, the first gas-outlet and the second gas-outlet are alternatively distributed, the first gas-outlet comprises a first sub-gas-outlet located in the center region and a second sub-gas-outlet located in the periphery region;
the first sub-gas-outlet and the second sub-gas-outlet are mutually isolated, the first sub-gas-outlet is used to output a first gas and the second sub-gas-outlet is used to output the second gas, the first gas and the second gas have film formation reaction;
a first gas channel is connected to the first sub-gas-outlet, the first gas passes through the first gas channel and outputs from the first sub-gas-outlet;
a second gas channel is connected to the second gas-outlet and the second sub-gas-outlet, the second gas channel and the first gas channel are mutually isolated;
the second gas passes through the second gas channel and outputs from the second gas-outlet and the second sub-gas-outlet.

2. The gas shower device of claim 1, wherein, the size of the second gas-outlet is larger than the first.

3. The gas shower device of claim 2, wherein, the first gas-outlet are strip-shaped gas channels.

4. The gas shower device of claim 3, wherein, the width of the first gas-outlet is smaller than the width of the second gas-outlet; the width of the first sub-gas-outlet is identical with the width of the second sub-gas-outlet.

5. The gas shower device of claim 1, wherein, for the first gas-outlet, the distance between the first sub-gas-outlet and the second sub-gas-outlet is 1 mm-3 mm.

6. The gas shower device of claim 1, wherein, the radius of the center region is 5 mm-30 mm smaller than the radius of the periphery region.

7. The gas shower device of claim 1, wherein, the distance from the center axis of the first gas-outlet to the center axis of the adjacent second gas-outlet is 10 mm-15 mm.

8. A chemical vapor deposition device, comprising:
a reaction chamber;
a carrier located at the bottom of the reaction chamber, wherein the carrier rotates around an axis, and the carrier has the wafer mounting region, the wafer mounted on the surface of wafer mounting region;
an exhaust channel located at the bottom of the reaction chamber;
the gas shower device of claim 1, wherein the gas shower device is located on the top of the reaction chamber, and wherein
the first gas-outlet and the second gas-outlet face the substrate, which are used to deliver the first gas and the second gas to the space between the gas shower device and the carrier;
the first gas channel is connected to the external of the reaction chamber and the first gas is inputted into the first gas channel from the external of the reaction chamber;
the second gas channel is connected to communicate with the reaction chamber and outside of the reaction chamber, and the second gas is inputted into the second gas channel from outside the reaction chamber.

9. The chemical vapor deposition device of claim 8, wherein the first gas includes the metalorganic gas or group V gas, and the second gas includes one or more gas selected from nitrogen-containing gas, hydrogen-containing gas and oxygen-containing gas.

10. The chemical vapor deposition device of claim 9, wherein the second gas consists of a gas selected from a group consisting of nitrogen, hydrogen, oxygen, and ammonia gas.

11. The chemical vapor deposition device of claim 9, wherein the second gas contains the mixed gas of nitrogen and hydrogen, or the mixed gas of nitrogen, hydrogen and ammonia gas.

12. The chemical vapor deposition device of claim 11, wherein the second gas further includes inert gas.

13. The chemical vapor deposition device of claim 9, wherein, when the first gas contains metalorganic gas, it does not contain group V gas;
when the first gas contains group V gas, it does not contain metalorganic gas;
the metalorganic gas and group V gas will be output from the first sub-gas-outlet alternatively.

14. The chemical vapor deposition device of claim 8, wherein the diameter of wafer mounting region is larger than the diameter of center region and smaller than the outer diameter of periphery region.

15. The chemical vapor deposition device of claim 8, further comprising a gas flow confinement ring located surrounding the gas shower device and the carrier, surrounds the space between the gas shower device and the carrier; the heater located under the bottom of the carrier is used to heat the substrate.

16. A chemical vapor deposition method employing chemical vapor deposition device of claim 8 includes:
placing the wafer on the surface of the wafer mounting region of the carrier;
outputting the first gas from the first sub-gas-outlet toward the carrier surface, when the first gas is inputted to the first gas channel from the external of the reaction chamber;
outputting the second gas from the second gas-outlet and the second sub-gas-outlet toward the carrier surface, the second gas is inputted to the second gas channel from the external of the chamber, wherein:
the second gas output from the second gas-outlet of the showerhead center region is mixed with the first gas output from the first sub-gas-outlet in the space between the gas shower device and the substrate, which reacts to form film at the surface of the wafer;

the second gas output from the second gas-outlet of the showerhead periphery region and from the second sub-gas-outlet forms a gas curtain, the gas curtain surrounds the space between showerhead center region and the carrier surface.

17. The chemical vapor deposition method of claim 16, wherein, the flow rate of the second gas output from the second sub-gas-outlet is 85%-115% of the flow rate of the first gas output from the first sub-gas-outlet.

18. The chemical vapor deposition method of claim 16, wherein, the flow rate of the second gas output from the second gas-outlet is faster than the flow rate of the first gas output from the first sub-gas-outlet.

19. A gas shower device, comprising:
    a showerhead, a gas injection region at the bottom of the showerhead includes a center region and a periphery region surrounding the center region;
    the center region and periphery region of the showerhead have a plurality of second gas-outlets;
    the second gas-outlets are used to output a second gas;
    a first gas-outlet is arranged between two adjacent second gas-outlets, the first gas-outlet and the second gas-outlet are alternatively distributed, the first gas-outlet comprises a first sub-gas-outlet located in the center region and a second sub-gas-outlet located in the periphery region;
    the first sub-gas-outlet and the second sub-gas-outlet are mutually isolated, the first sub-gas-outlet is used to output a first gas and the second sub-gas-outlet is used to output the second gas, the first gas and the second gas have film formation reaction;
    a first gas channel is connected to the first sub-gas-outlet, the first gas passes through the first gas channel and outputs from the first sub-gas-outlet;
    a second gas channel is connected to the second gas-outlet and the second sub-gas-outlet, the second gas channel and the first gas channel are mutually isolated;
    the second gas passes through the second gas channel and outputs from the second gas-outlet and the second sub-gas-outlet;
    wherein, the first gas-outlet comprises a plurality of groups of first gas holes, each group of first gas holes being arranged in straight lines and all the straight lines being parallel to each other, and the second gas-outlet comprises a plurality of groups of second gas holes, each group of second gas holes being arranged in straight lines and all of the straight lines being parallel to each other.

20. The gas shower device of claim 19, wherein, the diameter of the first gas hole is smaller than the diameter of the second gas hole; the diameter of the first gas hole composing the first sub-gas-outlet is identical with the diameter of the first gas hole composing the second sub-gas-outlet.

* * * * *